United States Patent
Oshima

(10) Patent No.: US 9,136,847 B2
(45) Date of Patent: Sep. 15, 2015

(54) SIGNAL TRANSMITTING-RECEIVING CONTROL CIRCUIT AND SECONDARY BATTERY PROTECTION CIRCUIT

(75) Inventor: Masashi Oshima, Kanagawa (JP)

(73) Assignee: RICOH ELECTRONIC DEVICES CO., LTD., Osaka (JP)

(*) Notice: Subject to any disclaimer, the term of this patent is extended or adjusted under 35 U.S.C. 154(b) by 434 days.

(21) Appl. No.: 13/635,402

(22) PCT Filed: Mar. 14, 2011

(86) PCT No.: PCT/JP2011/056507
§ 371 (c)(1),
(2), (4) Date: Sep. 14, 2012

(87) PCT Pub. No.: WO2011/115235
PCT Pub. Date: Sep. 22, 2011

(65) Prior Publication Data
US 2013/0002204 A1    Jan. 3, 2013

(30) Foreign Application Priority Data
Mar. 18, 2010   (JP) .................................. 2010-062389

(51) Int. Cl.
*H02J 7/00* (2006.01)
*H03K 17/687* (2006.01)
*H03K 19/0185* (2006.01)

(52) U.S. Cl.
CPC ....... *H03K 19/018521* (2013.01); *H02J 7/0026* (2013.01)

(58) Field of Classification Search
CPC ........... H03K 19/018521; H02J 7/0026; H02J 7/0021; H02J 7/0031; H02J 7/0016; H02J 2007/0037; H02J 2007/004; H01M 10/44; H01M 10/441; H01M 10/482; H01M 2010/4271; H01M 2010/4278
USPC .......................................... 320/134; 327/424
See application file for complete search history.

(56) References Cited

U.S. PATENT DOCUMENTS

| 8,148,944 B2 | 4/2012 | Goto |
| 2002/0069041 A1* | 6/2002 | Yokota ............................. 703/14 |

(Continued)

FOREIGN PATENT DOCUMENTS

| JP | 2-226760 | 9/1990 |
| JP | 06006203 A * | 1/1994 |

(Continued)

OTHER PUBLICATIONS

European Search Report dated Dec. 18, 2014 in corresponding European patent application No. 11 75 6418.7.

(Continued)

*Primary Examiner* — Vuthe Siek
*Assistant Examiner* — Aric Lin
(74) *Attorney, Agent, or Firm* — Cooper & Dunham LLP

(57) ABSTRACT

A signal transmitting-receiving circuit includes a first circuit including a first MOS transistor having a gate and a drain, a second MOS transistor having a gate and a drain connected to the gate and drain of the first MOS transistor, and a source connected to ground, and a transmitting terminal transmitting a signal connected to the drains of the first and second MOS transistors; and a second circuit including a receiving terminal receiving the signal transmitted from the transmitting terminal of the first circuit connected to the transmitting terminal, a third MOS transistor having a gate connected to the receiving terminal, a drain connected to a reference voltage generator circuit and a source connected to ground, a resistor connected between the third MOS transistor and the reference voltage generator circuit, and an output terminal connected between the resistor and the third MOS transistor.

7 Claims, 10 Drawing Sheets

(56) References Cited

U.S. PATENT DOCUMENTS

| | | |
|---|---|---|
| 2002/0075056 A1* | 6/2002 | Sauer .................... 327/345 |
| 2006/0012337 A1* | 1/2006 | Hidaka et al. ............ 320/119 |
| 2010/0060084 A1* | 3/2010 | Tange et al. ............. 307/130 |
| 2010/0097033 A1 | 4/2010 | Tange |
| 2010/0189467 A1 | 7/2010 | Sato et al. |
| 2010/0214633 A1 | 8/2010 | Sato et al. |
| 2010/0328747 A1 | 12/2010 | Jikutani et al. |
| 2011/0037432 A1 | 2/2011 | Sakurai et al. |
| 2011/0037825 A1 | 2/2011 | Jikutani et al. |

FOREIGN PATENT DOCUMENTS

| | | |
|---|---|---|
| JP | H6-6203 | 1/1994 |
| JP | 2000-354335 | 12/2000 |
| JP | 2004-112424 | 4/2004 |
| JP | 2006-29895 | 2/2006 |
| JP | 2007-218680 | 8/2007 |
| JP | 4080408 | 4/2008 |
| JP | 2009-17732 | 1/2009 |
| JP | 2009-055755 | 3/2009 |
| JP | 2009-195100 | 8/2009 |
| JP | 2010-124681 | 6/2010 |

OTHER PUBLICATIONS

International Search Report issued Jun. 21, 2011 in PCT/JP2011/056507 Filed on Mar. 14, 2011.

* cited by examiner

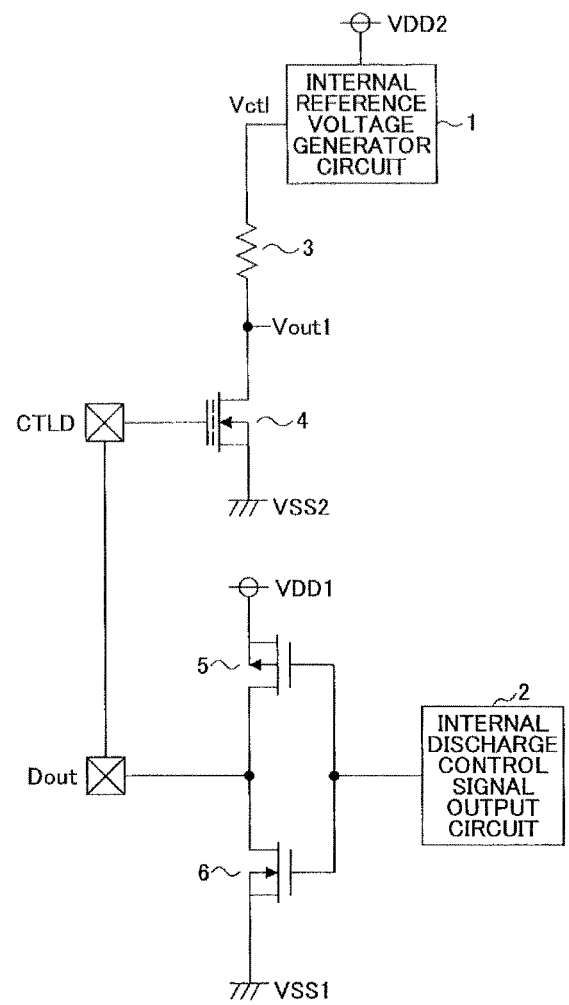

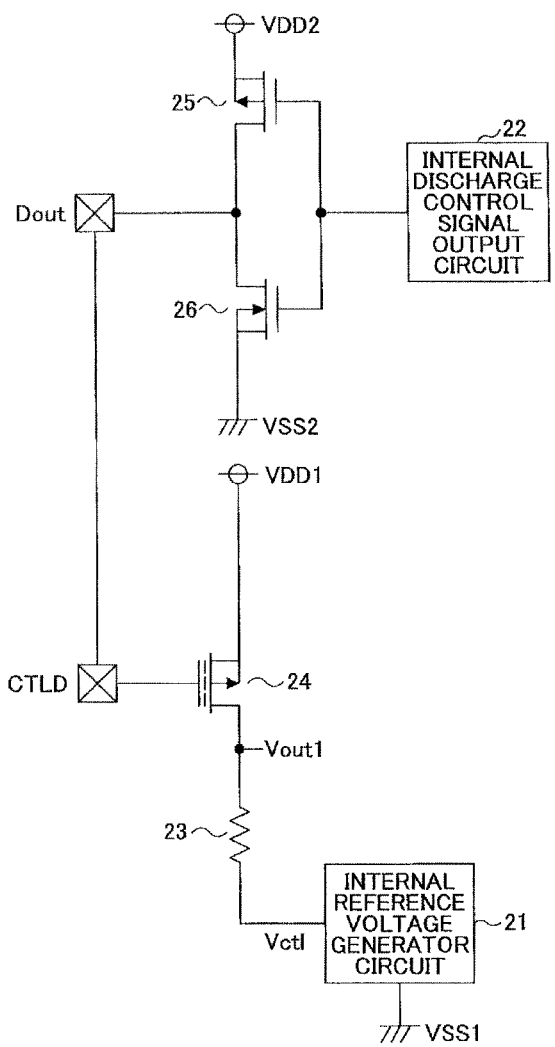

| Dout | CTLD | Vout1 | Vout2 |
|------|------|-------|-------|
| "H" | VDD1 | VSS2 | VSS2 |
| "L" | VSS1 | VSS2 | Vctl |
| open | INPUT VDD2 | VSS2 | VSS2 |
| open | INPUT VSS2 | Vctl | VSS2 |

| Dout | CTLD | Vout1 | Vout2 |
|---|---|---|---|
| "H" | VDD2 | Vctl | Vctl |
| "L" | VSS2 | VDD1 | Vctl |
| open | INPUT VDD1 | VDD1 | Vctl |
| open | INPUT VSS1 | VDD1 | VDD1 |

| Dout | CTLD | Vout1 |
|---|---|---|
| "H" | VDD1 | VSS2 |
| "L" | VSS1 | Vctl |

| Dout | CTLD | Vout1 |
|------|------|-------|
| "H"  | VDD2 | Vctl  |
| "L"  | VSS2 | VDD1  |

| Dout | CTLD | Vout1 |
|------|------|-------|
| Open | Vctl | VSS2 |
| "L"  | VSS1 | Vctl  |

| Dout | CTLD | Vout1 |
|---|---|---|
| Open | VDD1 | VSS2 |
| "L" | VSS1 | Vctl |

| Dout | CTLD | Vout1 |
|------|------|-------|
| "H"  | VDD2 | Vctl  |
| Open | VSS2 | VDD1  |

SIGNAL TRANSMITTING-RECEIVING CONTROL CIRCUIT AND SECONDARY BATTERY PROTECTION CIRCUIT

TECHNICAL FIELD

The invention relates to a technology for controlling signals transmitted and received between semiconductor devices. More specifically, the invention relates to a technology suitable for controlling signals transmitted and received between protection integrated circuits (hereinafter simply referred to as "protection ICs") in a secondary battery protection circuit to protect a battery pack (or a cell pack) having plural secondary batteries connected in series therein from overcharge or overdischarge. The protection ICs are configured to monitor output voltage fluctuations in the block of the secondary batteries to efficiently transmit and receive signals between the protection ICs.

BACKGROUND ART

Recently, there is a growing demand for mobile electronic devices. Such mobile electronic devices typically include a secondary battery (i.e., a battery cell) as a power source. Among various secondary batteries, a lithium-ion secondary battery is the mainstream of the secondary batteries owing to its lightweight and high energy density. Since the secondary batteries deteriorate due to overcharge or overdischarge, they generally include protection circuits (or secondary battery protection circuits) to protect the secondary batteries from being overcharged or overdischarged. Lithium-ion secondary batteries are particularly susceptible to deterioration due to overcharge or overdischarge, and hence, it is preferable that lithium-ion secondary batteries be provided with the secondary battery protection circuits.

Among the mobile electronic devices, a notebook personal computer (or a notebook PC) includes a battery pack that includes parallel-connected modules, each of which includes serially-connected batteries. When the lithium-ion secondary battery is utilized in the battery pack, all the serially-connected batteries may need to be monitored by the protection circuits.

Japanese Patent Application Publication No. 2000-354335 (hereinafter referred to as "Patent Document 1") discloses, for example, a technology for protecting serially-connected batteries from being overcharged or overdischarged, by providing protection circuits to respective batteries connected in series and connecting the protection circuits in parallel.

However, the technology disclosed in Patent Document 1 may need to include a photo-coupler or a field-effect transistor (FET) for integrating outputs of all the protection circuits of the batteries. Thus, a circuit structure may be complicated and hence, manufacturing cost may be increased.

Further, Japanese Patent No. 4080408 (hereinafter referred to as "Patent Document 2") discloses, for example, a technology to provide protection IC for protecting batteries connected in series regardless of the number of the batteries connected in series.

In the technology disclosed in Patent Document 2, the serially-connected batteries are divided into blocks so that there are plural blocks each having plural serially-connected batteries, and protection ICs are provided for the respective blocks to monitor output voltage fluctuation in the blocks. This protection IC includes a detector circuit to monitor voltages of the batteries in the block, an output terminal to externally output signals received from the detector circuit, a connecting terminal to connect the protection IC to a different protection IC, and an output circuit connected between the output terminal and the connecting terminal. Further, this output circuit includes a current source, a transistor, a changing device to change an electrical condition between the output terminal and the connecting terminal based on an output result from the detector circuit, and a transmitting device to transmit signals supplied to the connecting terminal to the output terminal via the different protection IC. In the output circuit, the current source is switched ON or OFF based on the output result of the detector circuit, and the current output from the current source is directly transmitted to the output terminal. Further, one of a source and a drain of the transistor is connected to the output terminal and the other connected to the connecting terminal to provide cascade connection between the detected result output terminals in each of the protection ICs. With this configuration, it may be possible to detect overcharge or overdischarge of all the blocks of batteries based on an output result of a final terminal of the protection IC.

However, in the technology disclosed in Patent Document 2, for example, if two serially-connected battery cells are protected by two protection circuits, a Cout/Dout terminal (i.e., a charge/discharge control signal transmitting terminal) of one of the battery cells transmits a signal to a CTLC/CTLD terminal (i.e., a charge/discharge control signal receiving terminal) of the other battery cell. At this moment, the amount of voltage applied to the internal elements may correspond to a sum of the voltages of the two battery cells at the maximum. Thus, the internal elements may need to be formed of high voltage resistant elements in order to withstand such amount of voltage. This may result in an increase in a process cost or increase in a layout area.

Japanese Patent Application Publication No. 2009-17732 (hereinafter referred to as "Patent Document 3") and Japanese Patent Application Publication No. 2009-195100 (hereinafter referred to as "Patent Document 4") disclose, for example, a technologies to withstand a large amount of voltage. However, current may flow from the Cout/Dout terminal of one of the battery cells to the CTLC/CTLD terminal of the other battery cell despite capabilities of the internal elements to withstand the large amount of voltage.

Thus, it may be necessary to provide an external voltage resistant element or a high voltage resistant element inside the IC to lower the current flowing from the Cout/Dout terminal of one of the battery cells to the CTLC/CTLD terminal of the other battery cell. However, providing the external voltage resistant element may result in an increase in component cost and an increase in a mounting area, and further, providing the high voltage resistant element inside the IC may result in an increase in the layout area.

Accordingly, it may be desirable to provide protection circuits that may protect battery cells without having the high voltage resistant element and without causing the current to flow between the protection circuits.

More specifically, it may be desirable to provide a secondary battery protection circuit that may suppress increases in the process cost, the layout area, the component cost, or the mounting area of the secondary battery protection circuit.

SUMMARY OF THE INVENTION

According to an embodiment, there is provided a signal transmitting-receiving circuit that includes a first circuit including a first MOS transistor having a gate and a drain, and configured to he switched on by a low signal supplied to the gate thereof; a second MOS transistor having a gate connected to the gate of the first MOS transistor, a drain connected to the drain of the first MOS transistor and a source connected to ground, and configured to be switched on by a high signal supplied to the gate thereof; and a transmitting terminal connected to the respective drains of the first MOS transistor and the second MOS transistor, and configured to transmit a signal, and a second circuit including a receiving terminal connected to the transmitting terminal of the first circuit, and configured to receive the signal transmitted from the transmitting terminal thereof; a third MOS transistor having a gate connected to the receiving terminal, a drain connected to a reference voltage generator circuit and a source connected to ground; a resistor connected between the third MOS transistor and the reference voltage generator circuit; and an output terminal connected between the resistor and the third MOS transistor.

According to an embodiment, there is provided a signal transmitting-receiving circuit that includes a first circuit including a first MOS transistor having a gate and a drain, and configured to be switched on by a low signal supplied to the gate thereof; a second MOS transistor having a gate connected to the gate of the first MOS transistor, a drain connected to the drain of the first MOS transistor and a source connected to ground, and configured to be switched on by a high signal supplied to the gate thereof; and a transmitting terminal connected to the respective drains of the first MOS transistor and the second MOS transistor, and configured to transmit a signal, and a second circuit including a receiving terminal connected to the transmitting terminal of the first circuit, and configured to receive the signal transmitted from the transmitting terminal thereof; a third MOS transistor having a gate connected to the receiving terminal, and a drain connected to a reference voltage generator circuit; a resistor connected between the third MOS transistor and the reference voltage generator circuit; and an output terminal connected between the resistor and the third MOS transistor.

According to an embodiment, there is provided a signal transmitting-receiving circuit that includes a first circuit including a first MOS transistor having a gate and a drain, and configured to be switched on by a low signal supplied to the gate thereof; a second MOS transistor having a gate connected to the gate of the first MOS transistor, a drain connected to the drain of the first MOS transistor and a source connected to ground, and configured to be switched on by a high signal supplied to the gate thereof; and a transmitting terminal connected to the respective drains of the first MOS transistor and the second MOS transistor, and configured to transmit a signal, and a second circuit including a receiving terminal connected to the transmitting terminal of the first circuit, and configured to receive the signal transmitted from the transmitting terminal thereof; a third MOS transistor having a gate connected to the receiving terminal, a drain connected to a reference voltage generator circuit and a source connected to ground; a resistor connected between the third MOS transistor and the reference voltage generator circuit; an output terminal connected between the resistor and the third MOS transistor; a fourth MOS transistor having a gate connected to the receiving terminal, a drain connected to ground and a source connected to the reference voltage generator circuit; an external signal receiving resistor connected between the fourth MOS transistor and the ground; and an external signal receiving output terminal connected between the external signal receiving resistor and the fourth MOS transistor.

According to an embodiment, there is provided a signal transmitting-receiving circuit that includes a first circuit including a first MOS transistor having a gate and a drain, and configured to be switched on by a low signal supplied to the gate thereof; a second MOS transistor having a gate connected to the gate of the first MOS transistor, a drain connected to the drain of the first MOS transistor and a source connected to ground, and configured to be switched on by a high signal supplied to the gate thereof; and a transmitting terminal connected to the respective drains of the first MOS transistor and the second MOS transistor, and configured to transmit a signal, and a second circuit including a receiving terminal connected to the transmitting terminal of the first circuit, and configured to receive the signal transmitted from the transmitting terminal thereof; a third MOS transistor having a gate connected to the receiving terminal, and a drain connected to a reference voltage generator circuit; a resistor connected between the third MOS transistor and the reference voltage generator circuit; an output terminal connected between the resistor and the third MOS transistor; a fourth MOS transistor having a gate connected to the gate of the third MOS transistor, a drain connected to a source voltage of the second circuit and a source connected to the reference voltage generator circuit; an external signal receiving resistor connected between the fourth MOS transistor and the source voltage of the second circuit; and an external signal receiving output terminal connected between the external signal receiving resistor and the fourth MOS transistor.

According to an embodiment, there is provided a signal transmitting-receiving circuit that includes a first circuit including a first MOS transistor having a gate, a drain and a source connected to ground, and configured to be switched on by a high signal supplied to the gate thereof; and a transmitting terminal connected to the drain of the first MOS transistor, and configured to transmit a signal, and a second circuit including a receiving terminal connected to the transmitting terminal of the first circuit, and configured to receive the signal transmitted from the transmitting terminal thereof; a second MOS transistor having a gate connected to the receiving terminal, a drain connected to a reference voltage generator circuit and a source connected to ground; a resistor connected between the second MOS transistor and the reference voltage generator circuit; an output terminal connected between the resistor and the second MOS transistor; and an external signal receiving resistor connected between the receiving terminal and the reference voltage generator circuit.

According to an embodiment, there is provided a signal transmitting-receiving circuit that includes a first circuit including a first MOS transistor having a gate and a drain, and configured to be switched on by a low signal supplied to the gate thereof; and a transmitting terminal connected to the drain of the first MOS transistor, and configured to transmit a signal, and a second circuit including a receiving terminal connected to the transmitting terminal of the first circuit, and configured to receive the signal transmitted from the transmitting terminal thereof; a second MOS transistor having a gate connected to the receiving terminal, and a drain connected to a reference voltage generator circuit; a resistor connected between the second MOS transistor and the reference voltage generator circuit; an output terminal connected between the resistor and the second MOS transistor; and an external signal receiving resistor connected between the receiving terminal and the reference voltage generator circuit.

According to an embodiment, there is provided a signal transmitting-receiving circuit that includes a first circuit including a first MOS transistor having a gate, a drain and a source connected to ground, and configured to be switched on by a high signal supplied to the gate thereof; and a transmitting terminal connected to the drain of the first MOS transistor, and configured to transmit a signal, and a second circuit including a receiving terminal connected to the transmitting terminal of the first circuit, and configured to receive the signal transmitted from the transmitting terminal thereof; a second MOS transistor having a gate connected to the receiving terminal, a drain connected to a reference voltage generator circuit and a source connected to ground; a resistor connected between the second MOS transistor and the reference voltage generator circuit; an output terminal connected between the resistor and the second MOS transistor; and an external pull-up resistor connected to the transmitting terminal of the first circuit.

According to an embodiment, there is provided a signal transmitting-receiving circuit that includes a first circuit including a first MOS transistor having a gate and a drain, and configured to be switched on by a low signal supplied to the gate thereof; and a transmitting terminal connected to the drain of the first MOS transistor, and configured to transmit a signal, and a second circuit including a receiving terminal connected to the transmitting terminal of the first circuit, and configured to receive the signal transmitted from the transmitting terminal thereof; a second MOS transistor having a gate connected to the receiving terminal, and a drain connected to a reference voltage generator circuit; a resistor connected between the second MOS transistor and the reference voltage generator circuit; an output terminal connected between the resistor and the second MOS transistor; and an external pull-down resistor connected to the transmitting terminal of the first circuit.

According to an embodiment, there is provided a secondary battery protection circuit for protecting a battery pack or a cell pack including serially-connected secondary batteries from overcharge or overdischarge. The secondary battery protection circuit includes plural protection circuits to monitor output voltage fluctuations of blocks of the secondary batteries and output detected results from detected result output terminals by cascade connecting the detected result output terminals; and any one of the above signal transmitting-receiving circuits for transmitting and receiving detected result signals between the plural protection circuits.

BRIEF DESCRIPTION OF THE DRAWINGS

Other objects and further features of embodiments will be apparent from the following detailed description when read in conjunction with the accompanying drawings, in which:

FIGS. 1A and 1B are a block diagram and a corresponding table illustrating a configuration example of a signal transmitting-receiving circuit according to a first embodiment;

FIGS. 2A and 2B are a block diagram and a corresponding table illustrating a configuration example of a signal transmitting-receiving circuit according to a second embodiment;

BEST MODE FOR CARRYING OUT THE INVENTION

Figure 3A:
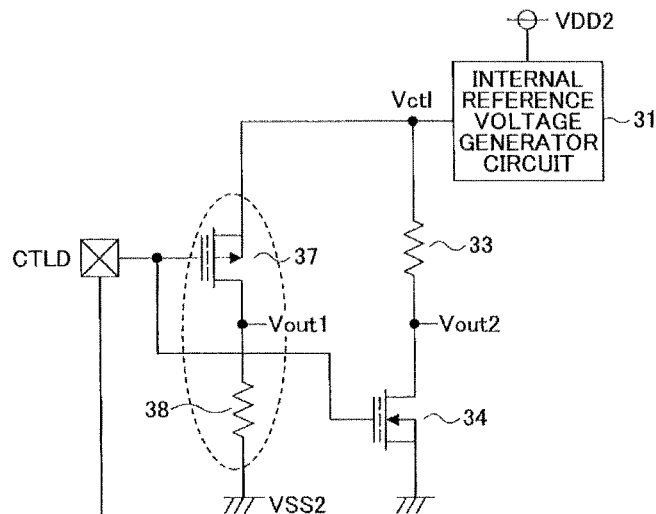
FIGS. 3A and 3B are a block diagram and a corresponding table illustrating a configuration example of a signal transmitting-receiving circuit according to a third embodiment.

In the following, embodiments of the present invention will be described with reference to the accompanying drawings. First, a signal transmitting-receiving circuit according to a first embodiment is described with reference to FIGS. 1A and 1B, and signal transmitting-receiving circuits according to a second to a tenth embodiments are illustrated likewise with reference to FIGS. 2A through 10B.

Note that in the following embodiments, elements illustrated in FIGS. 1A through 10B are provided in the secondary battery protection IC of the battery pack including the serially-connected batteries illustrated in Patent Document 2. In the secondary battery protection IC, input and output terminals have cascade connection, the output voltage fluctuation in each block of batteries is monitored, and overcharge and overdischarge are detected in all the blocks of the batteries based on the output of the final terminal of the protection IC.

Note also that descriptions are made based on an example of an overdischarge signal processing in the battery in the following embodiments.

[First Embodiment]

First, a configuration of the signal transmitting-receiving circuit according to the first embodiment is described with reference to FIGS. 1A and 1B.

As illustrated in FIG. 1A, the signal transmitting-receiving circuit according to the first embodiment includes an internal reference voltage generator circuit 1, an internal discharge control signal output circuit 2, a resistor 3, NMOS transistors 4 and 6, a PMOS transistor 5, a receiving terminal CLTD, and a transmitting terminal Dout.

The signal transmitting-receiving circuit according to the first embodiment is configured to transmit a signal output from a transmitting side protection IC (i.e., a first protection circuit illustrated in a lower side of FIG. 1A) to a receiving side protection circuit (i.e., a second protection circuit illustrated in an upper side of FIG. 1A). In the signal transmitting-receiving circuit according to the first embodiment, the internal discharge control signal output circuit 2, the PMOS transistor 5, the NMOS transistor 6 and the transmitting terminal Dout are provided to the transmitting side protection IC that transmits an overdischarge detection report signal, whereas the internal reference voltage generator circuit 1, the resistor 3, the NMOS transistor 4 and the receiving terminal CLTD are provided to the receiving side protection IC that receives the overdischarge detection report signal transmitted from the transmitting side protection IC.

In the signal transmitting-receiving circuit that transmits the signal output from the transmitting side protection IC (hereinafter also called a "first circuit" or "first protection IC") to the receiving side protection circuit (hereinafter also called a "second circuit" or a "second protection IC"), the transmitting side protection IC includes: the PMOS transistor 5 having a gate and a drain, and configured to be switched on by a low signal input to the gate of the PMOS transistor 5 from the internal discharge control signal output circuit 2, the NMOS transistor 6 having a gate connected to the gate of the PMOS transistor 5, a drain connected to the drain of the PMOS transistor 5 and a source connected to ground, and configured to be switched on by a high signal input to the gate of the NMOS transistor 6 from the internal discharge control signal output circuit 2, and the transmitting terminal Dout connected to the respective drains of the Nmos transistor 6 and the PMOS transistor 5. Further, in the signal transmitting-receiving circuit, the receiving side protection IC includes: the receiving terminal CTLD connected to the transmitting terminal Dout, the NMOS transistor 4 having a gate connected to the receiving terminal CTLD, a drain connected to the internal reference voltage generator circuit 1 that generates a reference voltage Vct1 and a source connected to ground, the resistor 3 connected between the NMOS transistor 3 and the internal reference voltage generator circuit 1, and the output terminal Vout1 connected between the resistor and the NMOS transistor 4.

Next, in the signal transmitting-receiving circuit according to the first embodiment having the above configuration, an operation of the signal transmitting-receiving circuit that transmits overdischarge states of the batteries detected by the first protection IC (i.e., transmitting side protection circuit illustrated in the lower side of FIG. 1A) to the second protection IC (i.e., receiving side protection circuit illustrated in the upper side of FIG. 1A) is described.

If the battery cells monitored by the first protection IC are normal states, the internal discharge control signal output circuit 2 outputs a high (H) signal, the PMOS transistor 5 is switched OFF, and the NMOS transistor 6 is switched ON. The transmitting terminal Dout is connected to a VSS1 (i.e., a ground voltage) via the NMOS transistor 6 so that the transmitting terminal Dout is switched to a low (L) level.

Conversely, if the battery cells monitored by the first protection IC are overdischarge states, the internal discharge control signal output circuit 2 outputs a low (L) signal, the PMOS transistor 5 is switched ON, and the NMOS transistor 6 is switched OFF. The transmitting terminal Dout is connected to a VDD1 (source voltage) via the PMOS transistor 5 so that the transmitting terminal Dout is switched to a high (H) level.

The signal output from the transmitting terminal Dout of the first protection IC illustrated in the lower side of FIG. 1A is supplied to the receiving terminal CTLD of the second protection IC illustrated in the upper side of FIG. 1A. If the transmitting terminal Dout is at a low (L) level, the NMOS transistor 4 is switched OFF, whereas if the transmitting terminal Dout is at a high (H) level, the NMOS transistor 4 is switched ON.

In the second protection IC illustrated in the upper side of FIG. 1A that receives a signal from the first protection IC illustrated in the lower side of FIG. 1A, voltages of the source and a back gate of the NMOS transistor 4 are equal to VSS2 (=VDD1), and a voltage of the drain of the NMOS transistor 4 fluctuates between the reference voltage Vct1 generated by the internal reference voltage generator circuit 1 in the second protection IC illustrated in the upper side of FIG. 1A and VSS2.

As a result, as illustrated in FIG. 1B, when the transmitting terminal Dout is at L level, a voltage of the signal received by the receiving terminal CTLD is equal to VSS1 and the output terminal Vout1 is equal to Vct1. By contrast, when the transmitting terminal Dout is at H level, a voltage of the signal received by the receiving terminal CTLD is equal to VDD1 and the voltage of the output terminal Vout1 is equal to VSS2.

Thus, if a low (L) signal (=VSS1 voltage) output from the transmitting terminal Dout of the first protection IC illustrated in the lower side of FIG. 1A is supplied to the gate of the NMOS transistor 4 via the receiving terminal CTLD of the second protection IC illustrated in the upper side of FIG. 1A, the voltage between the gate and the drain of the NMOS transistor 4, which is normally the maximum voltage, may be suppressed approximately to a voltage obtained by VDD1+Vct1.

Further, it is preferable that the reference voltage Vct1 be approximately 1 to 2 V insofar as the reference voltage Vct1 has a sufficient voltage level to drive a subsequent circuit.

Thus, in this configuration, it is preferable that the voltage resistance of an element used for the receiving terminal CTLD be approximately a sum of the maximum cell voltage and +2 V.

In this configuration, since the signal output from the first protection IC illustrated in the lower side of FIG. 1A is received by the gate of the NMOS transistor 4 of the second protection IC illustrated in the upper side of FIG. 1A, the signal transmission between the first protection IC illustrated in the lower side of FIG. 1A and the second protection IC illustrated in the upper side of FIG. 1A may be carried out without causing a current to flow between the first protection IC and the second protection IC.

Thus, since the current does not flow between the first protection IC and the second protection IC, an internal or external resistor may not be required for restricting the current flow. Accordingly, an increase in cost due to an additional external component or an increase in the layout area may be suppressed.

Note that the transmission of overdischarge states are used as examples in the description of the signal transmitting-receiving circuit according to the first embodiment; however, overcharge states may also be transmitted in the signal transmitting-receiving circuit according to the first embodiment.

[Second Embodiment]

Next, a configuration of a signal transmitting-receiving circuit according to a second embodiment is described with reference to FIGS. 2A and 2B. Note that In the signal transmitting-receiving circuit according to the second embodiment, the second protection IC of the first embodiment illustrated in the upper side of FIG. 1A and the first protection IC of the first embodiment illustrated in the lower side of FIG. 1A in the first embodiment are exchanged.

That is, as illustrated in FIG. 2A, the signal transmitting-receiving circuit according to the second embodiment includes an internal reference voltage generator circuit 21, an internal discharge control signal output circuit 22, a resistor 23, PMOS transistors 21 and 25, an NMOS transistor, a receiving terminal CLTD, and a transmitting terminal Dout.

The signal transmitting-receiving circuit according to the second embodiment is configured to transmit a signal output from a transmitting side protection IC (i.e., a first protection circuit illustrated in an upper side of FIG. 2A) to a receiving side protection circuit (i.e., a second protection circuit illustrated in a lower side of FIG. 2A). In the signal transmitting-receiving circuit according to the second embodiment, the internal discharge control signal output circuit 22, the PMOS transistor 25, the NMOS transistor 26 and the transmitting terminal Dout are provided to the transmitting side protection IC that transmits an overdischarge detection report signal, whereas the internal reference voltage generator circuit 21, the resistor 23, the PMOS transistor 24 and the receiving terminal CLTD are provided to the receiving side protection IC that receives the overdischarge detection report signal transmitted from the transmitting side protection IC.

In the signal transmitting-receiving circuit that transmits the signal output from the transmitting side protection IC (hereinafter also called a "first circuit" or "first protection IC") to the receiving side protection circuit (hereinafter also called a "second circuit" or a "second protection IC"), the transmitting side protection IC includes: the PMOS transistor 25 having a gate and a drain, and configured to be switched on by a low signal input to the gate of the PMOS transistor 25 from the internal discharge control signal output circuit 22, the NMOS transistor 26 having a gate connected to the gate of the PMOS transistor 25, a drain connected to the drain of the PMOS transistor 25 and a source connected to ground, and configured to be switched on by a high signal input to the gate of the NMOS transistor 26 from the internal discharge control signal output circuit 22, and the transmitting terminal Dout connected to the respective drains of the NMOS transistor 26 and the PMOS transistor 25. Further, in the signal transmitting-receiving circuit, the receiving side protection IC includes: the receiving terminal CTLD connected to the transmitting terminal Dout, the PMOS transistor 24 having a gate connected to the receiving terminal CTLD and a drain connected to the internal reference voltage generator circuit 21 that generates a reference voltage Vct1, the resistor 23 connected between the PMOS transistor 24 and the internal reference voltage generator circuit 21, and the output terminal Vout1 connected between the resistor 23 and the PMOS transistor 24.

Next, in the signal transmitting-receiving circuit according to the second embodiment having the above configuration, an operation of the signal transmitting-receiving circuit that transmits overdischarge states of the batteries detected by the first protection IC (i.e., transmitting side protection circuit illustrated in the upper side of FIG. 2A) to the second protection IC (i.e., receiving side protection circuit illustrated in the lower side of FIG. 2A) is described.

If the battery cells monitored by the first protection IC illustrated in the upper side of FIG. 2A are normal states, the internal discharge control signal output circuit 22 outputs a high (H) signal, the PMOS transistor 25 is switched OFF, and the NMOS transistor 26 is switched ON. The transmitting terminal Dout is connected to a VSS2 (i.e., a ground voltage) via the NMOS transistor 26 so that the transmitting terminal Dout outputs a low (L) signal.

Conversely, if the battery cells monitored by the first protection IC illustrated in the upper side of FIG. 2A are overdischarge states, the internal discharge control signal output circuit 22 outputs a low (L) signal, the PMOS transistor 25 is switched ON, and the NMOS transistor 26 is switched OFF. The transmitting terminal Dout is connected to a source voltage VDD2 via the PMOS transistor 25 so that the transmitting terminal Dout outputs a high (H) signal.

The signal output from the transmitting terminal Dout of the first protection IC illustrated in the upper side of FIG. 2A is supplied to the receiving terminal CTLD of the second protection IC illustrated in the lower side of FIG. 2A. If the transmitting terminal Dout is at a low (L level, the PMOS transistor 24 is switched ON, whereas if the transmitting terminal Dout is at a high (H) level, the PMOS transistor 24 is switched OFF.

In the second protection IC illustrated in the lower side of FIG. 2A that receives a signal from the first protection IC illustrated in the upper side of FIG. 2A, voltages of the source and a back gate of the PMOS transistor 24 are equal to VDD1, and a voltage of the drain of the PMOS transistor 24 fluctuates between the reference voltage Vct1 generated by the internal reference voltage generator circuit 21 in the second protection IC illustrated in the lower side of FIG. 2A and VDD1.

As a result, as illustrated in FIG. 2B, when the transmitting terminal Dout is at L level, a voltage of the signal received by the receiving terminal CTLD is equal to VSS2 and the output terminal Vout1 is equal to VDD1. By contrast, when the transmitting terminal Dout is at H level, a voltage of the signal received by the receiving terminal CTLD is equal to VDD1 and the voltage of the output terminal Vout1 is equal to Vct1.

Thus, if a low (L) signal (=VSS2 voltage) output from the transmitting terminal Dout of the first protection IC illustrated in the upper side of FIG. 2A is supplied to the gate of the PMOS transistor 24 via the receiving terminal CTLD of the second protection IC illustrated in the lower side of FIG. 2A, the voltage between the gate and the drain of the PMOS transistor 24, which is normally the maximum voltage, may be suppressed approximately to a voltage obtained by VDD2−VDD1+Vct1.

Further, it is preferable that the reference voltage Vct1 be approximately 1 to 2 V insofar as the reference voltage Vct1 has a sufficient voltage level to drive a subsequent circuit.

Thus, in this configuration, it is preferable that the voltage resistance of an element used for the receiving terminal CTLD be approximately a sum of the maximum cell voltage and +2 V.

In this configuration, since the signal output from the first protection IC illustrated in the upper side of FIG. 2A is received by the gate of the PMOS transistor 24 of the second protection IC illustrated in the lower side of FIG. 2A, the signal transmission between the first protection IC and the second protection IC may be carried out without causing a current to flow between the first protection IC and the second protection IC.

Thus, since the current does not flow between the first protection IC and the second protection IC, an internal or external resistor may not be required for restricting the current flow. Accordingly, an increase in cost due to an additional external component or an increase in the layout area may be suppressed.

[Third Embodiment]

Next, a configuration of a signal transmitting-receiving circuit according to a third embodiment is described with reference to FIGS. 3A and 3B.

In the signal transmitting-receiving circuit according to the third embodiment, the second protection IC of the first embodiment illustrated in the upper side of FIG. 1A is provided with a dual signal receiving transistor composed of two signal receiving transistors.

As illustrated in FIG. 3A, the signal transmitting-receiving circuit according to the third embodiment includes an internal reference voltage generator circuit 3, an internal discharge control signal output circuit 32, resistors 33 and 38, NMOS transistors 34 and 36, PMOS transistors 35 and 37, a receiving terminal CLTD, and a transmitting terminal Dout.

The signal transmitting-receiving circuit according to the third embodiment is configured to transmit a signal output from a transmitting side protection IC (i.e., a first protection circuit illustrated in a lower side of FIG. 3A) to a receiving side protection circuit (i.e., a second protection circuit illustrated in an upper side of FIG. 3A). In the signal transmitting-receiving circuit according to the third embodiment, the internal discharge control signal output circuit 32, the PMOS transistor 35, the NMOS transistor 36 and the transmitting terminal Dout are provided to the transmitting side protection IC that transmits an overdischarge detection report signal, whereas the internal reference voltage generator circuit 31, the resistors 33 and 38, the NMOS transistor 34, the PMOS transistor 37 and the receiving terminal CLTD are provided to the receiving side protection IC that receives the overdischarge detection report signal transmitted from the transmitting side protection IC.

Similar to the signal transmitting-receiving circuit according to the first embodiment illustrated in FIGS. 1A and 1B, FIGS. 3A and 3B illustrate an operation of the signal transmitting-receiving circuit that transmits overdischarge states of the batteries detected by the first protection IC (i.e., transmitting side protection circuit illustrated in the lower side of FIG. 3A) to the second protection IC (i.e., receiving side protection circuit illustrated in the upper side of FIG. 3A). Note that voltage fluctuation of an output terminal Vout2 connected to the drain of the NMOS transistor 34 based on the voltage fluctuation in the transmitting terminal Dout of the first protection IC illustrated in the lower side of FIG. 3A is similar to the voltage fluctuation of the output terminal Vout1 illustrated in the first embodiment, and its description is thus omitted.

Specifically, in the signal transmitting-receiving circuit according to the third embodiment, the second protection IC illustrated in the upper side of FIG. 3A includes a dual signal receiving transistor that is obtained by adding a new resistor 38 and a new PMOS transistor 37 to the second protection IC of the first embodiment illustrated in the upper side of FIG. 1A. Note that the signal transmitting-receiving circuit may include a triple or above signal receiving transistor composed of three or more signal receiving transistors.

That is, the PMOS transistor 37 utilized as an external signal receiving PMOS transistor includes a gate connected to the receiving terminal CTLD, a source connected to the internal reference voltage generator circuit 31 that generates the reference voltage Vct1 and a drain connected to ground (VSS2). The resistor 38 utilized as an external signal receiving resistor is connected between the drain of the PMOS transistor 37 and the ground (Vss2). The output terminal Vout1 utilized as an external signal receiving output terminal is connected between the resistor 38 and the PMOS transistor 37.

In this configuration, VSS2 is supplied to the output terminal Vout1 even if the transmitting terminal Dout of the first protection IC illustrated in the lower side of FIG. 3A is at a high (H) level and the receiving terminal CTLD of the second protection IC illustrated in the upper side of FIG. 3A is equal to VDD1 so that the PMOS transistor 37 of the second protection IC illustrated in the upper side of FIG. 3A is switched OFF; or even if the transmitting terminal Dout of the first protection IC illustrated in the lower side of 3A is at a low (L) level and the receiving terminal CTLD is equal to VSS1 so that the PMOS transistor 37 of the first protection IC illustrated in the lower side of FIG. 3A is switched ON.

Further, if the transmitting terminal Dout of the first protection IC is disconnected from the receiving terminal CTLD of the second protection IC and a voltage range of VDD2 to VSS2 is externally applied to the receiving terminal CTLD of the second protection IC, a signal may be transmitted to the internal circuit in a different state.

Figure 3B:
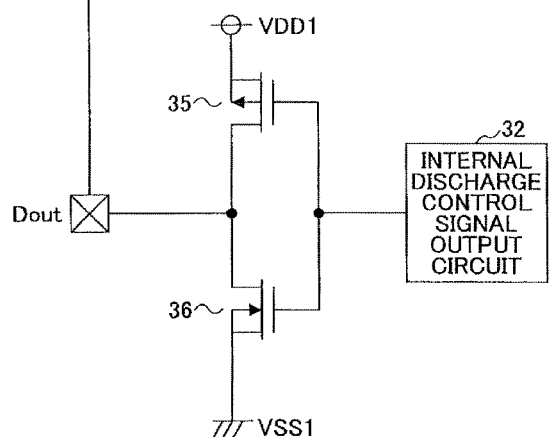

For example, as illustrated in FIG. 3B, if the transmitting terminal Dout=open and the receiving terminal CTLD=input VDD2, VSS2 is supplied to the output terminal Vout1 and also to the output terminal Vout2, and if the transmitting terminal Dout=open and the receiving terminal CTLD=input VSS2, Vct1 is supplied to the output terminal Vout1 and VSS2 is supplied to the output terminal Vout2.

[Fourth Embodiment]

Next, a configuration of a signal transmitting-receiving circuit according to a fourth embodiment is described with reference to FIGS. 4A and 4B.

In the signal transmitting-receiving circuit according to the fourth embodiment, the first protection IC illustrated in the lower side of FIG. 3A and the second protection IC illustrated in the upper side of FIG. 3A in the third embodiment are exchanged. Further, in the signal transmitting-receiving circuit according to the fourth embodiment, the second protection IC of the second embodiment illustrated in the lower side of FIG. 2A is provided with a dual signal receiving transistor composed of two signal receiving transistors.

Figures 4A, 4B:
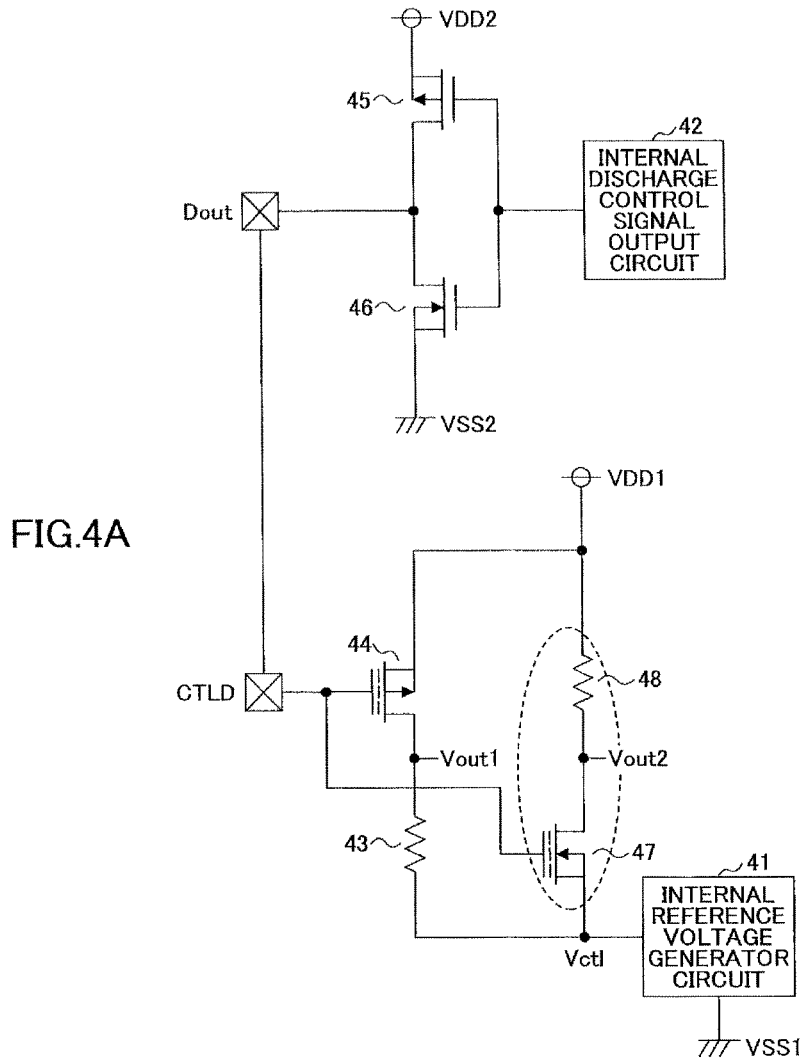
FIGS. 4A and 4B are a block diagram and a corresponding table illustrating a configuration example of a signal transmitting-receiving circuit according to a fourth embodiment.

As illustrated in FIG. 4A, the signal transmitting-receiving circuit according to the fourth embodiment includes an internal reference voltage generator circuit 41, an internal discharge control signal output circuit 42, resistors 43 and 48, PMOS transistors 44 and 46, NMOS transistors 45 and 47, a receiving terminal CLTD, and a transmitting terminal Dout.

The signal transmitting-receiving circuit according to the fourth embodiment is configured to transmit a signal output from a transmitting side protection IC (i.e., a first protection circuit illustrated in an upper side of FIG. 4A) to a receiving side protection circuit (i.e., a second protection circuit illustrated in a lower side of FIG. 4A). In the signal transmitting-receiving circuit according to the fourth embodiment, the internal discharge control signal output circuit 42, the PMOS transistor 45, the NMOS transistor 46 and the transmitting terminal Dout are provided to the transmitting side protection IC that transmits an overdischarge detection report signal, whereas the internal reference voltage generator circuit 41, the resistors 43 and 48, the PMOS transistor 44, the NMOS transistor 47 and the receiving terminal CLTD are provided to the receiving side protection IC that receives the overdischarge detection report signal transmitted from the transmitting side protection IC.

Similar to the signal transmitting-receiving circuit according to the second embodiment illustrated in FIGS. 2A and 2B, FIGS. 4A and 4B illustrate an operation of the signal transmitting-receiving circuit that transmits overdischarged states of the batteries detected by the first protection IC (i.e., transmitting side protection circuit illustrated in the upper side of FIG. 4A) to the second protection IC (i.e., receiving side protection circuit illustrated in the lower side of FIG. 4A). Note that voltage fluctuation of an output terminal Vout1 connected to the drain of the PMOS transistor 44 based on the voltage fluctuation in the transmitting terminal Dout of the first protection IC illustrated in the upper side of FIG. 4A is similar to the voltage fluctuation of the output terminal Vout1 illustrated in the second embodiment, and its description is thus omitted.

Specifically, in the signal transmitting-receiving circuit according to the fourth embodiment, the second protection IC illustrated in the lower side of FIG. 4A includes a dual signal receiving transistor by adding a new resistor 48 and a new NMOS transistor 47 to the second protection IC of the second embodiment illustrated in the lower side of FIG. 2A. Note that the signal transmitting-receiving circuit may include a triple or above signal receiving transistor composed of three or more signal receiving transistors.

That is, the NMOS transistor 47 utilized as an external signal receiving NMOS transistor includes a gate connected to a receiving terminal CTLD and also to a gate of the CMOS transistor 44, a drain connected to a VDD1 (i.e., a source voltage), and a source connected to the internal reference voltage generator circuit 41 that generates the reference voltage Vct1. The resistor 48 utilized as an external signal receiving resistor is connected between the NMOS transistor 47 and the VDD1 (i.e., a source voltage). The output terminal Vout2 utilized as an external signal receiving output terminal is connected between the resistor 48 and a drain of the NMOS transistor 47.

In this configuration, Vct1 is supplied to the output terminal Vout2 even if the transmitting terminal Dout of the first protection IC illustrated in the upper side of FIG. 4A is at a high (H) level and the receiving terminal CTLD of the second protection IC illustrated in the lower side of FIG. 4A is equal to VDD2 so that the NMOS transistor 47 of the second protection IC illustrated in the lower side of FIG. 4A is switched ON; or even if the transmitting terminal Dout of the first protection IC illustrated in the upper side of 4A is at a low (L) level and the receiving terminal CTLD is equal to VSS2 so that the NMOS transistor 47 of the first protection IC illustrated in the upper side of FIG. 4A is switched OFF.

Further, if the transmitting terminal Dout of the first protection IC is disconnected from the receiving terminal CTLD of the second protection IC and a voltage range of VDD2 to VSS2 is externally applied to the receiving terminal CTLD of the second protection IC, a signal may be transmitted to the internal circuit in a different state.

For example, as illustrated in FIG. 4B, if the transmitting terminal Dout=open and the receiving terminal CTLD=input VDD1, VDD1 is supplied to the output terminal Vout1 and Vct1 is supplied to the output terminal Vout2, and if the transmitting terminal Dout=open and the receiving terminal CTLD=input VSS1, VDD1 is supplied to the output terminal Vout1 and also to the output terminal Vout2.

[Fifth Embodiment]

Next, a configuration of a signal transmitting-receiving circuit according to a fifth embodiment is described with reference to FIGS. 5A and 5B.

The signal transmitting-receiving circuit according to the fifth embodiment is formed by providing an NMOS transistor 53 to the second protection IC of the first embodiment illustrated in the upper side in FIG. 1A in place of the resistor 3.

That is, in the signal transmitting-receiving circuit according to the first embodiment, a receiving inverter of the second protection IC illustrated in the upper side of FIG. 1A is implemented by the NMOS transistor 4 and the resistor 3 (see FIG. 1A). However, in the signal transmitting-receiving circuit according to the fifth embodiment, the receiving inverter of the second protection IC illustrated in the upper side of FIG. 5A is implemented by a combination of two MOS transistors 53 and 54 (see FIG. 5A). Note that the two MOS transistors 53 and 54 of the combination may be determined based on a subsequent circuit, and may be NMOS or PMOS transistors.

Figures 5A, 5B:
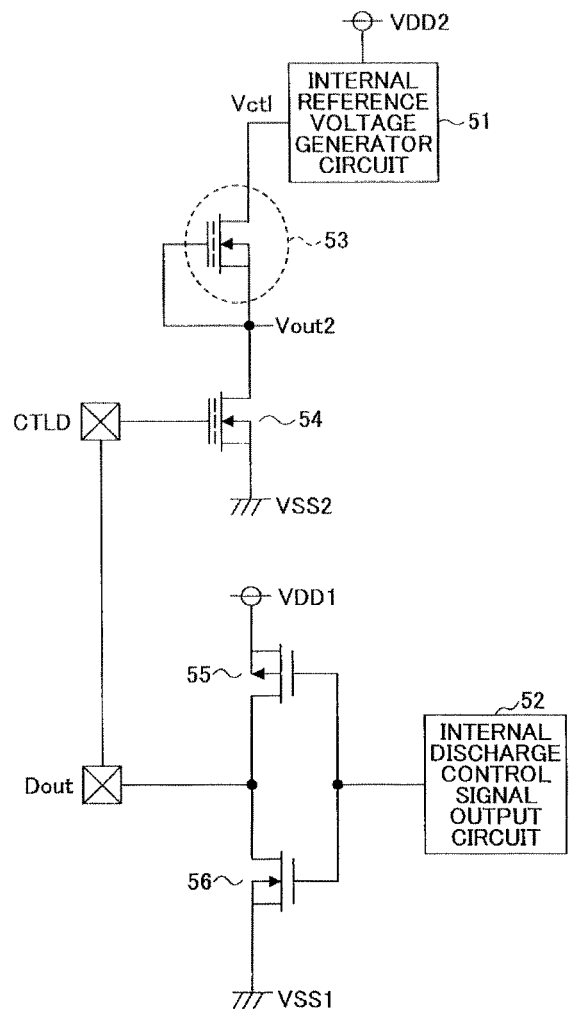
FIGS. 5A and 5B are a block diagram and a corresponding table illustrating a configuration example of a signal transmitting-receiving circuit according to a fifth embodiment.

It is preferable that the receiving side constant-current inverter of the second protection IC (i.e., receiving side protection IC) illustrated in the upper side of FIG. 5A be implemented by the combination of the two MOS transistors insofar as the combination of the two MOS transistors functions as the constant-current inverter with low voltage, low current, and high accuracy, compared to the receiving inverter implemented by the combination of the MOS transistor and the resistor.

[Sixth Embodiment]

Next, a configuration of a signal transmitting-receiving circuit according to a sixth embodiment is described with reference to FIGS. 6A and 6B.

The signal transmitting-receiving circuit according to the sixth embodiment is formed by providing a PMOS transistor 63 to the second protection IC of the second embodiment illustrated in the lower side in FIG. 2A in place of the resistor 23.

That is, in the signal transmitting-receiving circuit according to the second embodiment, a receiving inverter of the second protection IC illustrated in the lower side of FIG. 2A is implemented by the PMOS transistor 24 and the resistor 23 (see FIG. 2A). However, in the signal transmitting-receiving circuit according to the sixth embodiment, the receiving inverter of the second protection IC illustrated in the lower side of FIG. 5A is implemented by two MOS transistors 63 and 64 (see FIG. 6A). Note that the two MOS transistors 63 and 64 of the combination may be determined based on a subsequent circuit, and may be NMOS or PMOS transistors.

Figures 6A, 6B:
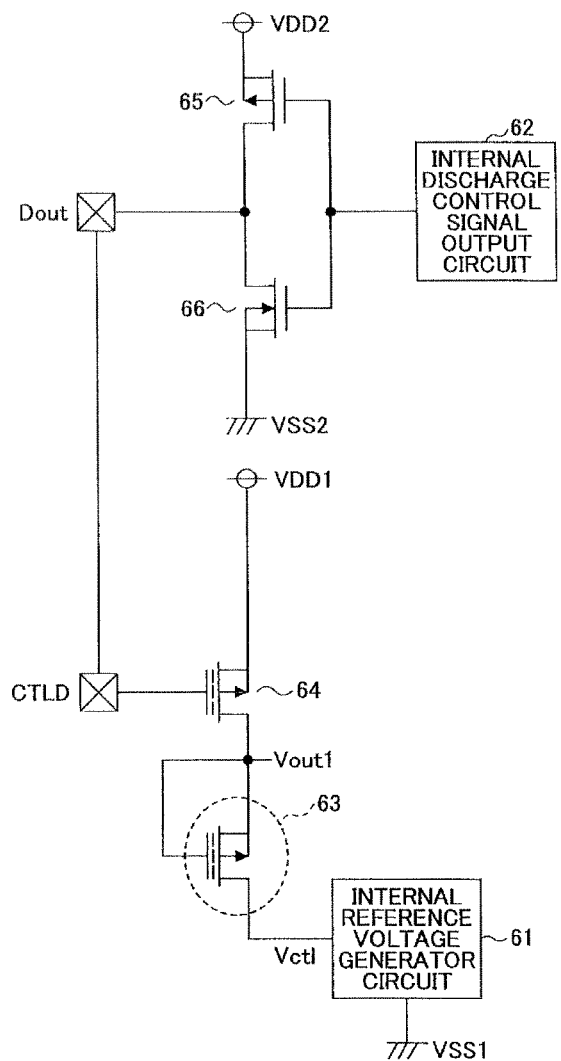
FIGS. 6A and 6B are a block diagram and a corresponding table illustrating a configuration example of a signal transmitting-receiving circuit according to a sixth embodiment.

It is preferable that the receiving side constant-current inverter of the second protection IC (i.e., receiving side protection IC) illustrated in the lower side of FIG. 6A be implemented by the combination of the two MOS transistors insofar as the combination of the two MOS transistors functions as the constant-current inverter with low voltage, low current, and high accuracy, compared to the receiving inverter implemented by the combination of the MOS transistor and the resistor.

[Seventh Embodiment]

Next, a configuration of a signal transmitting-receiving circuit according to a seventh embodiment is described with reference to FIGS. 7A and 7B.

Figures 7A, 7B:
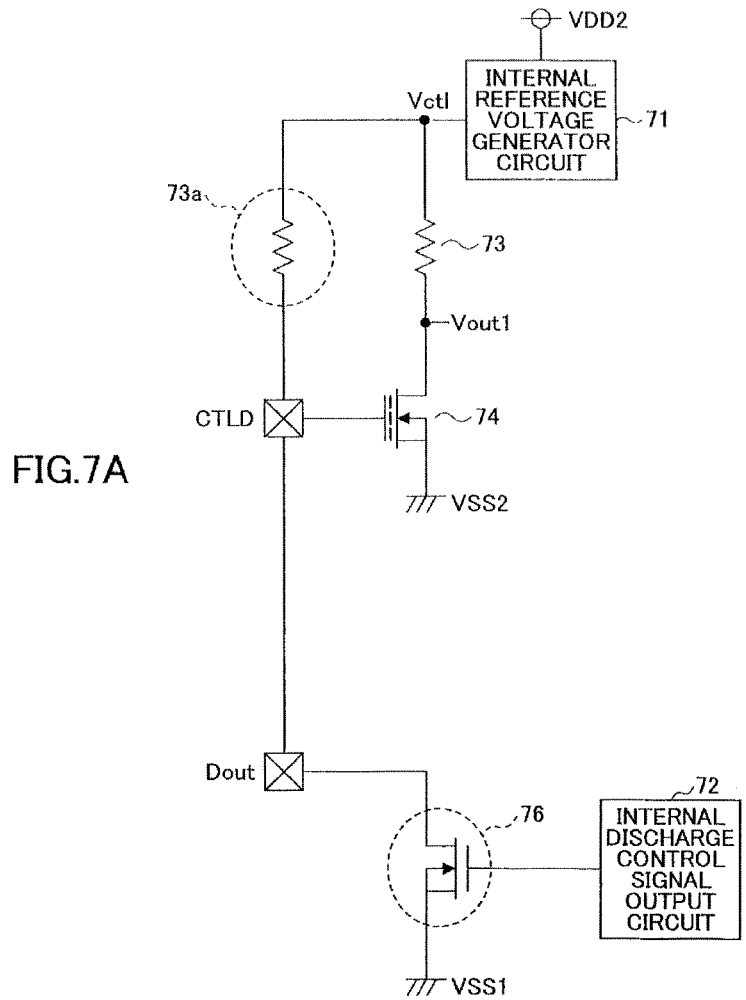
FIGS. 7A and 7B are a block diagram and a corresponding table illustrating a configuration example of a signal transmitting-receiving circuit according to a seventh embodiment.

As illustrated in FIG. 7A, the signal transmitting-receiving circuit according to the seventh embodiment includes a resistor 73 and an NMOS transistor 74 provided to the second protection IC (i.e., receiving side IC) illustrated in the upper side of FIG. 7A, similar to the second protection IC of the first embodiment illustrated in the upper side of FIG. 1A, and further includes a new internal pull-up resistor 73a configured to pull a voltage up to Vct1. Further, in the first protection IC (i.e., transmitting side IC) of the signal transmitting-receiving circuit according to the seventh embodiment illustrated in the lower side of FIG. 7A, the PMOS transistor 5 provided to the first protection IC of the first embodiment illustrated in the lower side of FIG. 1A is removed such that the first protection IC of the seventh embodiment illustrated in the lower side of FIG. 7A includes the NMOS transistor 76 alone.

With this configuration, if the NMOS transistor 76 of the first protection IC (i.e., transmitting side circuit) illustrated in the lower side of FIG. 7A performs an open drain output (i.e., Dout=open) as illustrated in FIG. 7B, a reference voltage Vct1 output from the internal reference voltage generator circuit 71 is applied to the receiving terminal CTLD visa resistor 73a in the second protection IC (i.e., receiving side circuit) illustrated in the upper side of FIG. 7A. Accordingly, even if the NMOS transistor 76 of the first protection IC (i.e., transmitting side circuit) illustrated in the lower side of FIG. 7A is switched OFF, the voltage of the receiving terminal CTLD may be stabilized by pulling the voltage of the receiving terminal CTLD up to the reference voltage Vct1. Thus, the signal of the output terminal Vout1 may be appropriately controlled.

[Eighth Embodiment]

Next, a configuration of a signal transmitting-receiving circuit according to an eighth embodiment is described with reference to FIGS. 8A and 8B.

Figures 8A, 8B:
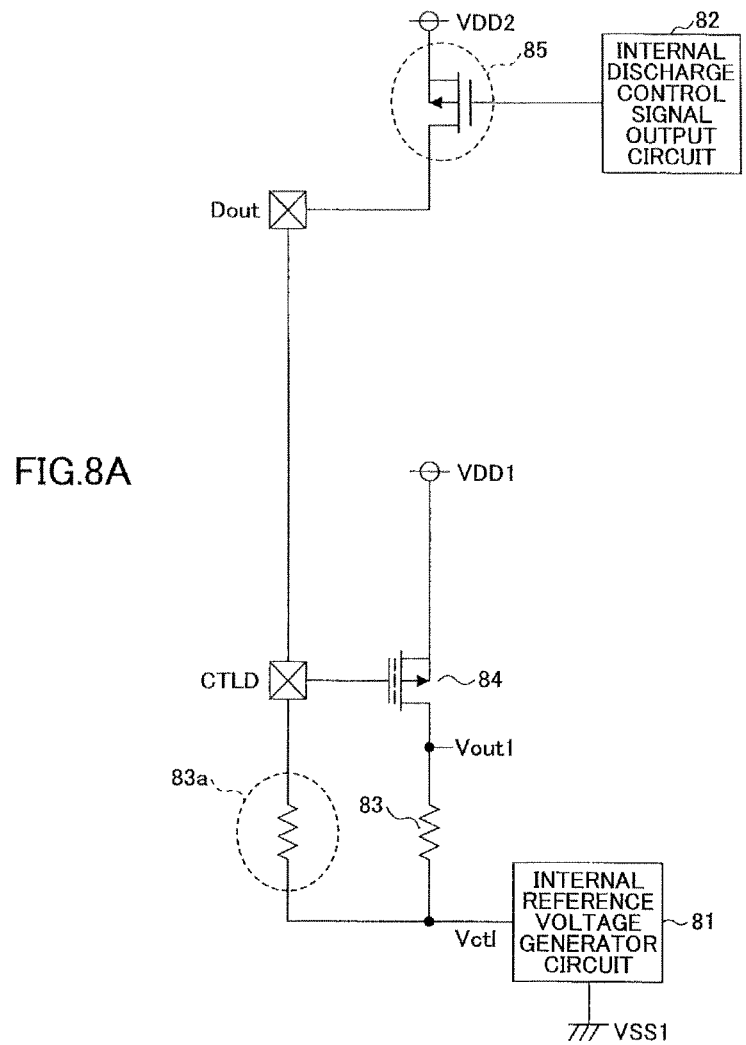
FIGS. 8A and 8B are a block diagram and a corresponding table illustrating a configuration example of a signal transmitting-receiving circuit according to an eighth embodiment.

As illustrated in FIG. 8A, the signal transmitting-receiving circuit according to the eighth embodiment includes a resistor 83 and a PMOS transistor 84 provided to the second protection IC (i.e., receiving side IC) illustrated in the lower side of FIG. 8A, similar to the second protection IC of the second embodiment illustrated in the lower side of FIG. 2A, and further includes a new internal pull-down resistor 83a configured to pull a voltage down to Vct1. Further, in the first protection IC (i.e., transmitting side IC) of the signal transmitting-receiving circuit according to the eighth embodiment illustrated in the upper side of FIG. 8A, the NMOS transistor 26 provided to the first protection IC of the second embodiment illustrated in the upper side of FIG. 2A is removed such that the first protection IC of the eighth embodiment illustrated in the upper side of FIG. 8A includes the PMOS transistor 85 alone.

With this configuration, if the PMOS transistor 85 of the first protection IC (i.e., transmitting side circuit) illustrated in the upper side of FIG. 8A performs an open drain output (i.e., Dout=open) as illustrated in FIG. 8B, a reference voltage Vct1 output from the internal reference voltage generator circuit 81 is applied to the receiving terminal CTLD via the resistor 83a in the second protection IC (i.e., receiving side circuit) illustrated in the lower side of FIG. 8A. Accordingly, even if the PMOS transistor 85 of the first protection IC (i.e., transmitting side circuit) illustrated in the upper side of FIG. 8A is switched OFF, the voltage of the receiving terminal CTLD may be stabilized by pulling the voltage of the receiving terminal CTLD down to the reference voltage Vct1. Thus, the signal of the output terminal Vout1 may be appropriately controlled.

[Ninth Embodiment]

Next, a configuration of a signal transmitting-receiving circuit according to a ninth embodiment is described with reference to FIGS. 9A and 9B.

Figures 9A, 9B:
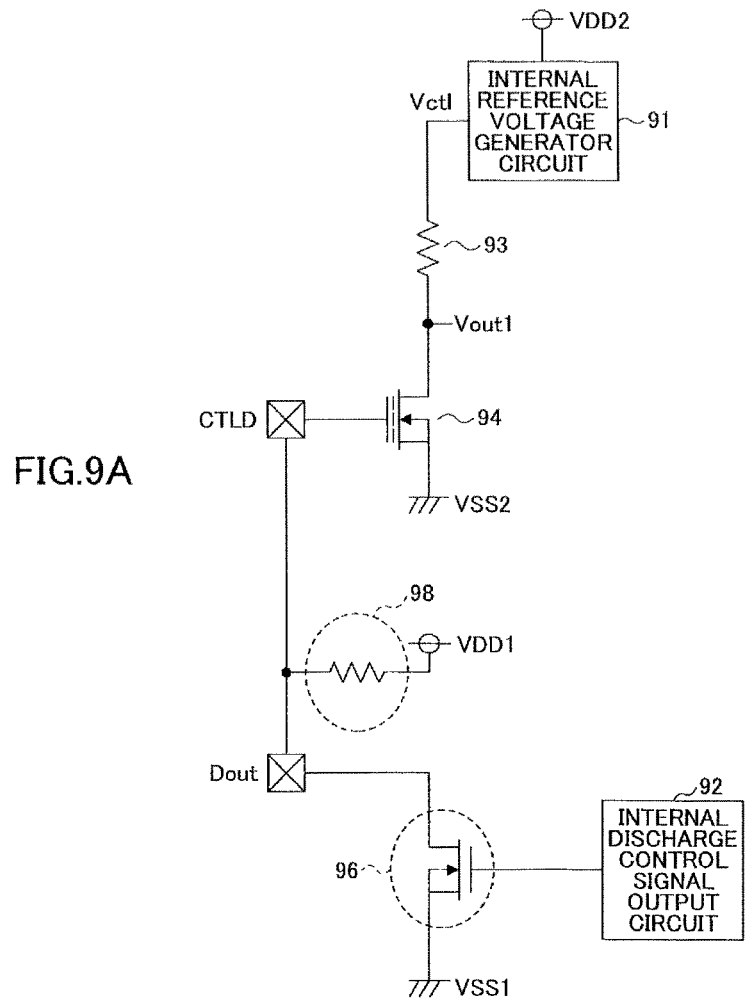
FIGS. 9A and 9B are a block diagram and a corresponding table illustrating a configuration example of a signal transmitting-receiving circuit according to a ninth embodiment.

As illustrated in FIG. 9A, the signal transmitting-receiving circuit according to the ninth embodiment includes a resistor 93 and an NMOS transistor 94 provided to the second protection IC (i.e., receiving side IC) illustrated in the upper side of FIG. 9A, similar to the second protection IC of the first embodiment illustrated in the upper side of FIG. 1A. Further, in the first protection IC (i.e., transmitting side IC) of the signal transmitting-receiving circuit according to the ninth embodiment illustrated in the lower side of FIG. 9A, the PMOS transistor 5 provided to the first protection IC of the first embodiment illustrated in the lower side of FIG. 1A is removed such that the first protection IC of the ninth embodiment illustrated in the lower side of FIG. 9A includes the NMOS transistor 96 alone. Moreover, an external resistor 98 is connected to an output side of the transmitting terminal Dout of the first protection IC illustrated in the lower side of FIG. 9A to pull the voltage up to the voltage VDD1.

With this configuration, if the NMOS transistor 96 of the first protection IC (i.e., transmitting side circuit) illustrated in the lower side of FIG. 9A performs an open drain output (i.e., Dout=open) as illustrated in FIG. 9B, the voltage VDD1 is applied to the transmitting terminal Dout of the second protection IC (i.e., receiving side circuit) illustrated in the upper side of FIG. 9A via the external resistor 98. Accordingly, even if the NMOS transistor 96 of the first protection IC (i.e., transmitting side circuit) illustrated in the lower side of FIG. 9A is switched OFF, the voltage of the receiving terminal CTLD may be stabilized by pulling the voltage of the transmitting terminal Dout up to the voltage VDD1. Thus, the signal of the output terminal Vout1 may be appropriately controlled.

[Tenth Embodiment]

Next, a configuration of a signal transmitting-receiving circuit according to a tenth embodiment is described with reference to FIGS. 10A and 10B.

Figures 10A, 10B:
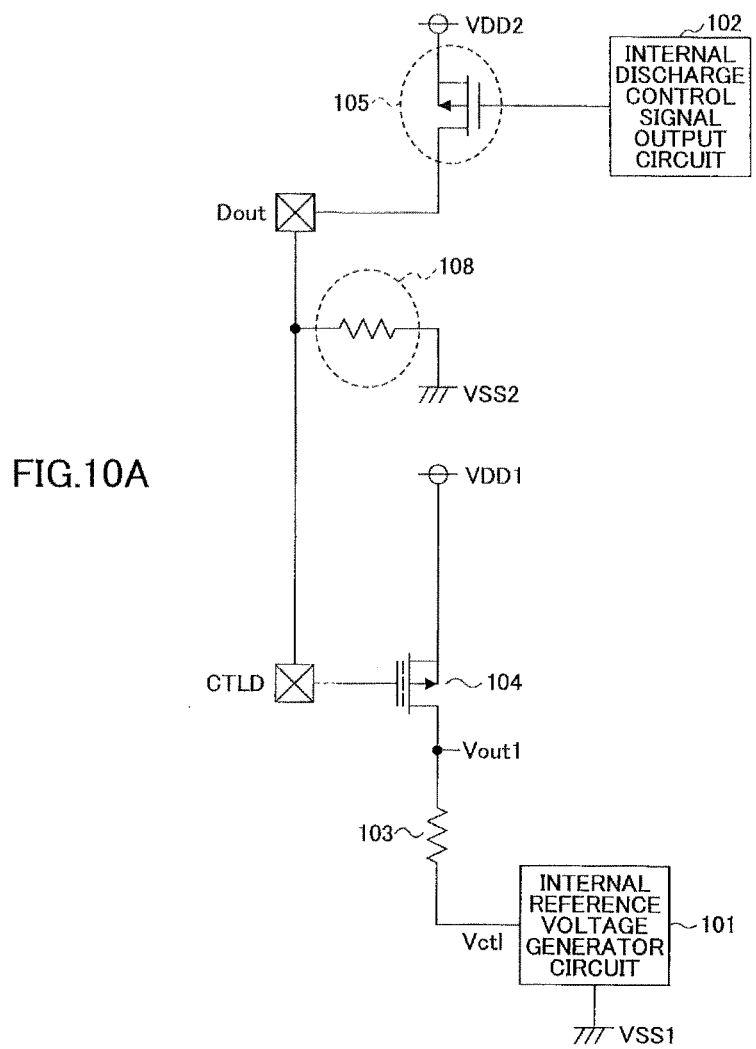
FIGS. 10A and 10B are a block diagram and a corresponding table illustrating a configuration example of a signal transmitting-receiving circuit according to a tenth embodiment.

As illustrated in FIG. 10A, the signal transmitting-receiving circuit according to the tenth embodiment includes a resistor 103 and a PMOS transistor 104 provided to the second protection IC (i.e., receiving side IC) illustrated in the lower side of FIG. 10A, similar to the second protection IC of the second embodiment illustrated in the lower side of FIG. 2A. Further, in the first protection IC (i.e., transmitting side IC) of the signal transmitting-receiving circuit according to the tenth embodiment illustrated in the upper side of FIG. 10A, the NMOS transistor 26 provided to the first protection IC of the second embodiment illustrated in the upper side of FIG. 2A is removed such that the first protection IC of the tenth embodiment illustrated in the upper side of FIG. 10A includes the PMOS transistor 105 alone. Moreover, an external resistor 108 is connected to an output side of the transmitting terminal Dout of the first protection IC illustrated in the upper side of FIG. 10A to pull the voltage down to the voltage VSS2.

With this configuration, if the PMOS transistor 105 of the first protection IC (i.e., transmitting side circuit) illustrated in the upper side of FIG. 10A performs an open drain output (i.e., Dout=open) as illustrated in FIG. 10B, the voltage VSS2 is applied to the transmitting terminal Dout of the first protection IC (i.e., transmitting side circuit) illustrated in the upper side of FIG. 10A via the external resistor 108. Accordingly, even if the PMOS transistor 105 of the first protection IC (i.e., transmitting side circuit) illustrated in the upper side of FIG. 10A is switched OFF, the voltage of the transmitting terminal Dout may be stabilized by pulling the voltage of the transmitting terminal Dout down to the voltage VSS2. Thus, the signal of the output terminal Vout1 may be appropriately controlled.

As described above with reference to FIGS. 1A through 10B, in the signal transmitting-receiving circuit according to the first through tenth embodiments, when a signal is transmitted and received between the first and second protection ICs, voltages of nodes other than the gates of the MOS transistors of the receiving side ICs (i.e., second protection ICs) are suppressed by the reference voltages or the like inside the receiving side ICs. Thus, the signal transmitting-receiving circuit according to the first through tenth embodiments may not require elements having greater voltage resistance.

That is, as illustrated in FIGS. 1A and 1B, in the signal transmitting-receiving circuit, the transmitting side circuit includes a transmitting side PMOS transistor 5 having a gate and a drain, and configured to be switched on by a low signal supplied from the transmitting circuit to the gate of the PMOS transistor 5; a transmitting side NMOS transistor 6 having a gate connected to the gate of the PMOS transistor 5, a drain connected to the drain of the PMOS transistor 5 and a source connected to ground (VSS1), and configured to be switched on by a high signal supplied from the transmitting circuit to the gate the NMOS transistor 6; and a transmitting terminal Dout connected to the respective drains of the NMOS transistor 6 and the PMOS transistor 5, and the receiving side circuit includes a receiving terminal CTLD connected to the transmitting terminal Dout; a receiving side NMOS transistor 4 having a gate connected to the receiving terminal CTLD, a drain connected to a reference voltage generator circuit 1 that generates a reference voltage Vct1 and a source connected to ground (VSS2); a resistor 3 connected between the NMOS transistor 4 and a reference voltage generator circuit 1 generating the reference voltage Vct1; and an output terminal Vout1 connected between the resistor 3 and the NMOS transistor 4.

Alternatively, as illustrated in FIGS. 2A and 2B, in the signal transmitting-receiving circuit, the transmitting side circuit includes a transmitting side PMOS transistor 25 having a gate and a drain, and configured to be switched on by a low signal supplied from the transmitting circuit to the gate of the PMOS transistor 25; a transmitting side NMOS transistor 26 having a gate connected to the gate of the PMOS transistor 25, a drain connected to the drain of the PMOS transistor 25 and a source connected to ground (VSS2), and configured to be switched on by a high signal supplied from the transmitting circuit to the gate the NMOS transistor 26; and a transmitting terminal Dout connected to the respective drains of the NMOS transistor 26 and the PMOS transistor 25, and the receiving side circuit includes a receiving terminal CTLD connected to the transmitting terminal Dout; a receiving side PMOS transistor 24 having a gate connected to the receiving terminal CTLD and a source connected to an internal reference voltage generator circuit 21 that generates a reference voltage Vct1; a resistor 23 connected between the PMOS transistor 24 and a reference voltage generator circuit 21 generating the reference voltage Vct1; and an output terminal Vout1 connected between the resistor 23 and the PMOS transistor 24.

With this configuration, a sufficiently low voltage (Vct1) may be applied (added) to the voltages of the source, drain, and back gate of the transistor of the receiving side IC that receives signals output from the transmitting side IC such that the inverter inverts the voltages of the source, drain, and back gate of the transistor of the receiving side IC. Accordingly, even if the output signal of the transmitting side IC fluctuates fully between the voltages VDD and VSS of the transmitting side IC, the transistors of the receiving side IC receive a voltage obtained by VDD+Vct1 at most.

Further, since the signal is received by the gate of the MOS transistor, the current will not flow from the transmitting side IC to the receiving side IC.

Further, as illustrated in FIGS. 3A through 4B, since the signal transmitting-receiving circuit include plural inverters to which input signals are supplied, the signals supplied to the receiving side IC may be controlled in various manners. That is, since the received signals are easily managed by the plural transistors, the signal supplied to the receiving side IC may be controlled in various manners.

Further, as illustrated in FIGS. 7A through 8B, if the signal transmitting-receiving circuit include an open drain output circuit and the output is in an open state, the receiving terminal may be stabilized (prevented from being unstable) by allowing the reference voltage generator circuit to pull up or pull down the voltage of the receiving terminal.

That is, even if the transmitting side output circuit has an open drain output configuration and the output is in an open state, the voltage of the receiving terminal may be stabilized by allowing the resistor or the like to pull up or pull down the voltage of the receiving terminal. Thus, the signal supplied to the receiving terminal may be appropriately controlled.

Further, as illustrated in FIGS. 9A through 10B, if the signal transmitting-receiving circuit include an open drain output circuit and the output is in an open state, the receiving terminal may be stabilized (prevented from being unstable) by allowing the external resistor or the like provided in the open drain circuit to pull up or pull down the voltage of the receiving terminal. Accordingly, the signal supplied to the receiving terminal may be appropriately controlled.

That is, even if the transmitting side output circuit has an open drain output configuration and the output is in an open state, the voltage of the receiving terminal may be stabilized by allowing the external resistor or the like to pull up or pull down the voltage of the receiving terminal to the transmitting side VDD or VSS. Thus, the signal supplied to the receiving terminal may be appropriately controlled without allowing a current to flow between the transmitting side IC and the receiving side IC.

Thus, the signal transmitting-receiving circuit according to the embodiments may not require high voltage resistant elements to withstand a total voltage of two battery cells. Accordingly, the manufacturing process may be simplified and the manufacturing cost may be lowered.

Further, use of high voltage resistant elements generally increases the layout area. However, the signal transmitting-receiving circuit according to the embodiments may not require high voltage resistant elements to withstand a total voltage of two battery cells. Accordingly, the layout area may be reduced.

Further, a secondary battery protection circuit to protect a battery pack (or a cell pack) including serially-connected secondary batteries from overcharge or overdischarge that includes plural protection circuits to monitor output voltage fluctuations of blocks of the secondary batteries and output detected results from detected result output terminals by cascade connecting the detected result output terminals; and a signal transmitting-receiving circuit having one of the configurations illustrated in FIGS. 1A through 10B for transmitting and receiving detected result signals between the plural protection circuits. With this configuration, the secondary battery protection circuit maybe made smaller and may have increased performance.

Note that the first to tenth embodiments are not limited to those examples described with reference to FIGS. 1A through 10B, and various alterations and variations may be made without departing from the scope of the invention. For example, in the first to tenth embodiments, the transmission of overdischarge states are used as examples in the description of the signal transmitting-receiving circuit that transmits detected signals. However, as illustrated in the description of the first embodiments, overcharge states may also be transmitted instead of overdischarge states in the signal transmitting-receiving circuit according to the second through tenth embodiments.

According to the first to tenth embodiments, there is provided a secondary battery protection circuit having plural protection circuits that may protect plural battery cells without utilizing high voltage resistant elements and without causing a current to flow between the plural protection circuits. With this configuration, it may be possible to suppress the increases in the process cost, the layout area, the component cost, or the mounting area of the secondary battery protection circuit.

Further, the present invention is not limited to these embodiments, but various variations and modifications may be made without departing from the scope of the present invention.

The present application is based on Japanese priority application No. 2010-062389 filed on Mar. 18, 2010, with the Japanese Patent Office, the entire contents of which are hereby incorporated by reference.

The invention claimed is:

1. A signal transmitting-receiving circuit comprising:
   a first circuit including:
      a first MOS transistor having a gate and a drain, and configured to be switched on by a signal supplied to the gate thereof;
      a second MOS transistor having a gate connected to the gate of the first MOS transistor, a drain connected to the drain of the first MOS transistor and a source connected to ground, and configured to be switched on by a high signal supplied to the gate thereof; and
      a transmitting terminal connected to the respective drains of the first MOS transistor and the second MOS transistor, and configured to transmit a signal; and a second circuit including:
   a receiving terminal connected to the transmitting terminal of the first circuit, and configured to receive the signal transmitted from the transmitting terminal thereof;
   a third MOS transistor having a gate connected to the receiving terminal, and a drain connected to a reference voltage generator circuit;
   a resistor connected between the third MOS transistor and the reference voltage generator circuit;
   an output terminal connected between the resistor and the third MOS transistor;
   a fourth MOS transistor having a gate connected to the receiving terminal;
   a drain connected to ground and a source connected to the reference voltage generator circuit;
   an external signal receiving resistor connected between the fourth MOS transistor and the ground; and
   an external signal receiving output terminal connected between the external signal receiving resistor and the fourth MOS transistor,
   wherein a source of the third MOS transistor is connected to ground.

2. The signal transmitting-receiving circuit as claimed in claim 1, wherein a source of the third MOS transistor is connected to ground.

3. The signal transmitting-receiving circuit as claimed in claim 1, wherein the resistor is formed of one of an NMOS transistor and a PMOS transistor.

4. The signal transmitting-receiving circuit as claimed in claim 1, wherein the external signal receiving resistor is formed of one of an NMOS transistor and a PMOS transistor.

5. A signal transmitting-receiving circuit comprising:
a first circuit including:
   a first MOS transistor having a gate and a drain, and configured to be switched on by a signal supplied to the gate thereof;
   a second MOS transistor having a gate connected to the gate of the first MOS transistor, a drain connected to the drain of the first MOS transistor and a source connected to ground, and configured to be switched on by a high signal supplied to the gate thereof; and
   a transmitting terminal connected to the respective drains of the first MOS transistor and the second MOS transistor, and configured to transmit a signal; and
a second circuit including:
   a receiving terminal connected to the transmitting terminal of the first circuit, and configured to receive the signal transmitted from the transmitting terminal thereof;
   a third MOS transistor having a gate connected to the receiving terminal, and a drain connected to a reference voltage generator circuit;
   a resistor connected between the third MOS transistor and the reference voltage generator circuit;
   an output terminal connected between the resistor and the third MOS transistor;
   a fourth MOS transistor having a gate connected to the gate of the third MOS transistor;
   a drain connected to a source voltage of the second circuit and a source connected to the reference voltage generator circuits;
   an external signal receiving resistor connected between the fourth MOS transistor and the source voltage of the second circuit; and
   an external signal receiving output terminal connected between the external signal receiving resistor and the fourth MOS transistor.

6. The signal transmitting-receiving circuit as claimed in claim 5,
   wherein the external signal receiving resistor is formed of one of an NMOS transistor and a PMOS transistor.

7. The signal transmitting-receiving circuit as claimed in claim 5, wherein the resistor is formed of one of an NMOS transistor and a PMOS transistor.

* * * * *